(12) United States Patent
Stamper et al.

(10) Patent No.: US 11,004,878 B2
(45) Date of Patent: May 11, 2021

(54) PHOTODIODES INTEGRATED INTO A BICMOS PROCESS

(71) Applicant: GLOBALFOUNDRIES U.S. Inc., Santa Clara, CA (US)

(72) Inventors: Anthony K. Stamper, Williston, VT (US); Vibhor Jain, Essex Junction, VT (US); Steven M. Shank, Jericho, VT (US); John J. Ellis-Monaghan, Grand Isle, VT (US); John J. Pekarik, Underhill, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/544,074

(22) Filed: Aug. 19, 2019

(65) Prior Publication Data

US 2021/0057462 A1     Feb. 25, 2021

(51) Int. Cl.
| | |
|---|---|
| *H01L 27/144* | (2006.01) |
| *H01L 29/04* | (2006.01) |
| *H01L 29/165* | (2006.01) |
| *H01L 29/737* | (2006.01) |
| *H01L 29/06* | (2006.01) |
| *H01L 29/66* | (2006.01) |

(Continued)

(52) U.S. Cl.
CPC ......... *H01L 27/1443* (2013.01); *H01L 29/04* (2013.01); *H01L 29/0649* (2013.01); *H01L 29/165* (2013.01); *H01L 29/66242* (2013.01); *H01L 29/7375* (2013.01); *H01L 31/02019* (2013.01); *H01L 31/0312* (2013.01); *H01L 31/105* (2013.01); *H01L 31/1812* (2013.01); *H01L 31/1872* (2013.01); *G01S 7/4816* (2013.01); *H03F 3/08* (2013.01)

(58) Field of Classification Search
CPC ........... H01L 27/1443; H01L 29/66242; H01L 29/0649; H01L 31/02019; H01L 29/04; H01L 29/7375; H01L 31/0312; H01L 31/1812; H01L 31/105; H01L 31/1872; H01L 29/165; H03F 3/08; G01S 7/4816
See application file for complete search history.

(56) References Cited

U.S. PATENT DOCUMENTS 5,747,860 A  *  5/1998  Sugiyama ............. B82Y 20/00
                                                        257/19
6,667,528 B2   12/2003  Cohen et al.
(Continued)

OTHER PUBLICATIONS

D. Knoll et al., "High-performance BiCMOS Si photonics platform," 2015 IEEE Bipolar/BiCMOS Circuits and Technology Meeting—BCTM, Boston, MA, 2015, pp. 88-96.

*Primary Examiner* — Ratisha Mehta
*Assistant Examiner* — Md M Islam
(74) *Attorney, Agent, or Firm* — Thompson Hine LLP Francois Pagette

(57) ABSTRACT

Structures including a photodiode and methods of fabricating such structures. A substrate has a top surface, a well, and a trench extending from the top surface to the well. A photodiode is positioned in the trench. The photodiode includes an electrode that is provided by a first portion of the well. A bipolar junction transistor has an emitter that is positioned over the top surface of the substrate and a subcollector that is positioned below the top surface of the substrate. The subcollector is provided by a second portion of the well.

19 Claims, 8 Drawing Sheets

(51) Int. Cl.
*H01L 31/02* (2006.01)
*H01L 31/105* (2006.01)
*H01L 31/18* (2006.01)
*H01L 31/0312* (2006.01)
G01S 7/481 (2006.01)
H03F 3/08 (2006.01)

(56) References Cited

U.S. PATENT DOCUMENTS

| | | |
|---|---|---|
| 7,777,250 B2 | 8/2010 | Lochtefeld |
| 7,790,495 B2 | 9/2010 | Assefa et al. |
| 8,313,967 B1 | 11/2012 | Lee et al. |
| 8,637,411 B2 | 1/2014 | Swaminathan et al. |
| 8,956,983 B2 | 2/2015 | Swaminathan et al. |
| 9,064,699 B2 | 6/2015 | Wang et al. |
| 9,864,136 B1 * | 1/2018 | Jacob .................... H01L 31/105 257/458 |
| 2001/0037133 A1 | 11/2001 | Knudson et al. |
| 2002/0109147 A1 | 8/2002 | Shirai et al. |
| 2007/0023811 A1 * | 2/2007 | Voegeli ............. H01L 29/66242 257/302 |
| 2007/0099315 A1 | 5/2007 | Maa et al. |
| 2008/0070355 A1 | 3/2008 | Lochtefeld et al. |
| 2009/0072284 A1 | 3/2009 | King et al. |
| 2012/0009802 A1 | 1/2012 | LaVoie et al. |
| 2017/0104537 A1 * | 4/2017 | Radice ................ H03F 3/45475 |
| 2017/0194476 A1 * | 7/2017 | Brueck ............. H01L 21/02458 |

\* cited by examiner

PHOTODIODES INTEGRATED INTO A BiCMOS PROCESS

BACKGROUND

The present invention relates to photonics chips and, more particularly, to structures including a photodiode and methods of fabricating such structures.

Light Detection and Ranging (LIDAR) is a laser-mapping technology that measures distance to a target by illuminating the target with pulsed laser light and measuring the reflected pulses with a sensor. LIDAR finds use, for example, in autonomous robots and self-driving cars. The sensor employed in a LIDAR system, and also in other infrared wavelength motion detection systems, is a germanium photodiode. Germanium possesses high absorption in the infrared wavelength range. Typically, a two-chip solution is used in which one chip includes one or more germanium photodiodes and a second chip includes a trans-impedance amplifier as well as associated logic and input/output. Each germanium photodiode converts impinging electromagnetic radiation into current as photons are absorbed. The trans-impedance amplifier amplifies the current generated by the photodiode and converts the current into a voltage.

Improved structures including a photodiode and methods of fabricating such structures are needed.

SUMMARY

In an embodiment of the invention, a structure includes a substrate having a top surface, a well, and a trench extending from the top surface to the well, and a photodiode is positioned in the trench. The photodiode includes an electrode that is provided by a first portion of the well. The structure further includes a bipolar junction transistor having an emitter positioned over the top surface of the substrate and a subcollector positioned below the top surface of the substrate. The subcollector of the bipolar junction transistor is provided by a second portion of the well.

In an embodiment of the invention, a method includes forming a well in a substrate, patterning a trench extending from a top surface of the substrate to the well, forming a photodiode in the trench, and forming a bipolar junction transistor having an emitter positioned over the top surface of the substrate and a subcollector positioned below the top surface of the substrate. The photodiode includes an electrode that is provided by a first portion of the well. The subcollector of the bipolar junction transistor is provided by a second portion of the well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
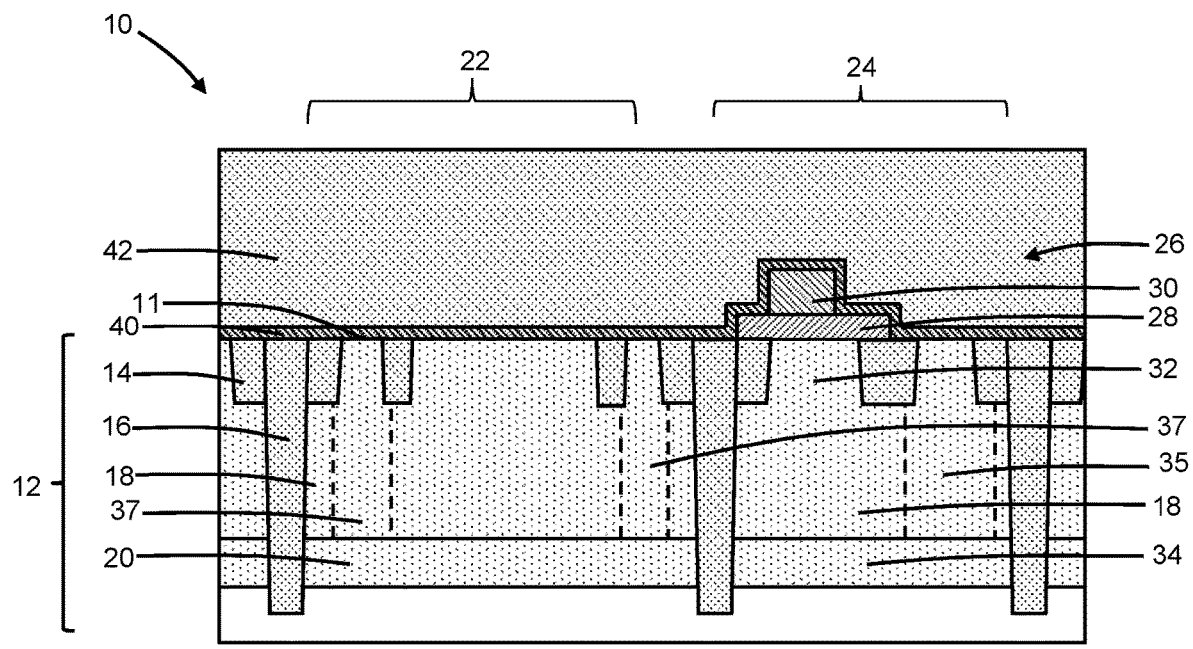
FIGS. 1-4 are cross-sectional views of a structure at successive fabrication stages of a processing method in accordance with embodiments of the invention.

With reference to FIG. 1 and in accordance with embodiments of the invention, a structure 10 includes a substrate 12, shallow trench isolation regions 14 located in the substrate 12, deep trench isolation regions 16 located in the substrate 12, a shallow well 18 located in the substrate 12, and a deep well 20 located in the substrate 12. The deep trench isolation regions 16 define a region 22 of the substrate 12 that may be used to fabricate a photodiode, and a region 24 of the substrate 12 that may be used to fabricate a bipolar junction transistor 26. An additional region (not shown) of the substrate 12 may be used to fabricate field-effect transistors as part of a BiCMOS process. The substrate 12 may be, for example, a bulk substrate composed of a single-crystal semiconductor material, such as a bulk single-crystal silicon substrate.

The shallow trench isolation regions 14 and deep trench isolation regions 16 may be formed in the substrate 12 by etching associated trenches of different depths in the substrate 12 and depositing a dielectric material, such as silicon dioxide, in the trenches. In the representative embodiment, the deep trench isolation regions 16 may extend from a top surface 11 of the substrate 12 to a portion of the substrate 12 beneath (i.e., under) the deep well 20. In an alternative embodiment, the deep trench isolation regions 16 may extend from the top surface 11 of the substrate 12 into the substrate 12 and terminate within the deep well 20. Portions of the deep well 20 are in direct contact with the dielectric material, which is solid, of the deep trench isolation regions 16.

The shallow well 18 and the deep well 20 may be formed by respective ion implantations that introduce a dopant, such as an n-type dopant (e.g., arsenic (As) and/or phosphorus (P)), into the substrate 12. The ions for each implantation may be generated from a suitable source gas and implanted into the substrate 12 with given implantation conditions using an ion implantation tool. The implantation conditions (e.g., ion species, dose, kinetic energy, tilt angle) may be selected to tune the characteristics (e.g., depth profile) of the different wells 18, 20. The deep well 20 is located at a greater depth in the substrate 12 than the shallow well 18. The shallow well 18 may have a different dopant concentration than the deep well 20. In an embodiment, the wells 18, 20 contain semiconductor material having a conductivity type (i.e., n-type) of opposite polarity to the conductivity type of the substrate 12, which may contain lightly-doped p-type semiconductor material.

The bipolar junction transistor 26 includes a base layer 28 located over the substrate 12 in region 24 and an emitter 30 that is located on a top surface of the base layer 28. The base layer 28 may be composed of a semiconductor material, such as a silicon-germanium alloy with a content of silicon ranging from 95 atomic percent to 50 atomic percent and a content of germanium ranging from 5 atomic percent to 50 atomic percent. The semiconductor material of the base layer 28 may contain a dopant, such as a p-type dopant (e.g., boron) that provides p-type conductivity and, optionally, carbon to suppress the out-diffusion of the p-type dopant. The base layer 28 may be formed from a layer of semiconductor material deposited using a low-temperature epitaxial growth process, such as vapor phase epitaxy.

The emitter 30 may be composed of a different semiconductor material than the base layer 28 and may have an opposite conductivity type from the base layer 28. For example, the emitter 30 may lack germanium that is present in at least a portion of the base layer 28, and the emitter 30 may contain an n-type dopant. In a representative embodiment, the emitter 30 may be composed of a polycrystalline semiconductor material, such as polysilicon, deposited by chemical vapor deposition and the semiconductor material may be heavily doped with a concentration of an n-type dopant (e.g., phosphorus or arsenic) to provide n-type conductivity.

The bipolar junction transistor 26 includes a collector 32 and a subcollector 34 represented by different sections of the substrate 12. Each of the different sections may contain a concentration of an n-type dopant (e.g., phosphorus or arsenic) to provide n-type conductivity. The collector 32 may be constituted by a portion of the shallow well 18 in region 24 that is isolated from the portion of the shallow well 18 in the region 22 of the substrate 12 by the deep trench isolation regions 16. The subcollector 34 may be constituted by a portion of the deep well 20. In an embodiment in which the deep trench isolation regions 16 penetrate through the deep well 20, the subcollector 34 may be a portion of the deep well 20 that is isolated from the portion of the deep well 20 in the region 22 of the substrate 12 by the deep trench isolation regions 16. In an embodiment in which the deep trench isolation regions 16 terminate within the deep well 20, the portion of the deep well 20 providing the subcollector 34 may be electrically connected with the portion of the deep well 20 in the region 22 of the substrate 12.

A doped region 35 may couple the subcollector 34 to the top surface 11 of the substrate 12 to provide a contact area at the top surface 11 in region 24. Another doped region 37 may couple the deep well 20 to the top surface 11 of the substrate 12 to provide a contact area at the top surface 11 in region 22. The doped regions 35, 37 have the same conductivity type as the wells 18, 20 and extend through the shallow well 18 to the deep well 20. The doped regions 35, 37 may be formed by a shared ion implantation or by separate ion implantations of a dopant, such as an n-type dopant (e.g., arsenic (As) and/or phosphorus (P)) that provides n-type conductivity. The ions used to form the doped regions 35, 37 may be generated from a suitable source gas and implanted into the substrate 12 with given implantation conditions using an ion implantation tool. The implantation conditions (e.g., ion species, dose, kinetic energy, tilt angle) may be selected to tune the characteristics (e.g., depth profile) of the doped regions 35, 37. An implantation mask may be applied to the substrate 12 in order to localize the positions of the doped regions 35, 37. The implantation mask has a thickness sufficient to stop the energetic ions before reaching the substrate 12. Following implantation, the implantation mask may be removed.

The base layer 28 includes an intrinsic base that is coextensive with the emitter 30 along a p-n junction and that is coextensive with the collector 32 along another p-n junction. Sections of the base layer 28 arranged peripheral to the intrinsic base and surrounding the emitter 30 may define an extrinsic base that provides a surface area for landing a contact to the base layer 28. The bipolar junction transistor 26 may be characterized as a heterojunction bipolar transistor (HBT) if at least two or all three of the base layer 28, the emitter 30, and the collector 32 are composed of semiconductor materials with different bandgaps.

A conformal protection layer 40 may be deposited over the bipolar junction transistor 26 and over the surface of the substrate 12 in region 22. A dielectric layer 42 may be blanket deposited over the conformal protection layer 40. The conformal protection layer 40 may be composed of silicon dioxide or silicon nitride, and the dielectric layer 42 may be composed of, for example, borophosphosilicate glass (BPSG). The bipolar junction transistor 26 is coated by the conformal protection layer 40 and is buried in the dielectric layer 42.

In an alternative embodiment, the bipolar junction transistor 26 may be replaced by a different type of device structure such as, for example, a field-effect transistor or an extended-drain field-effect transistor.

Figure 2:
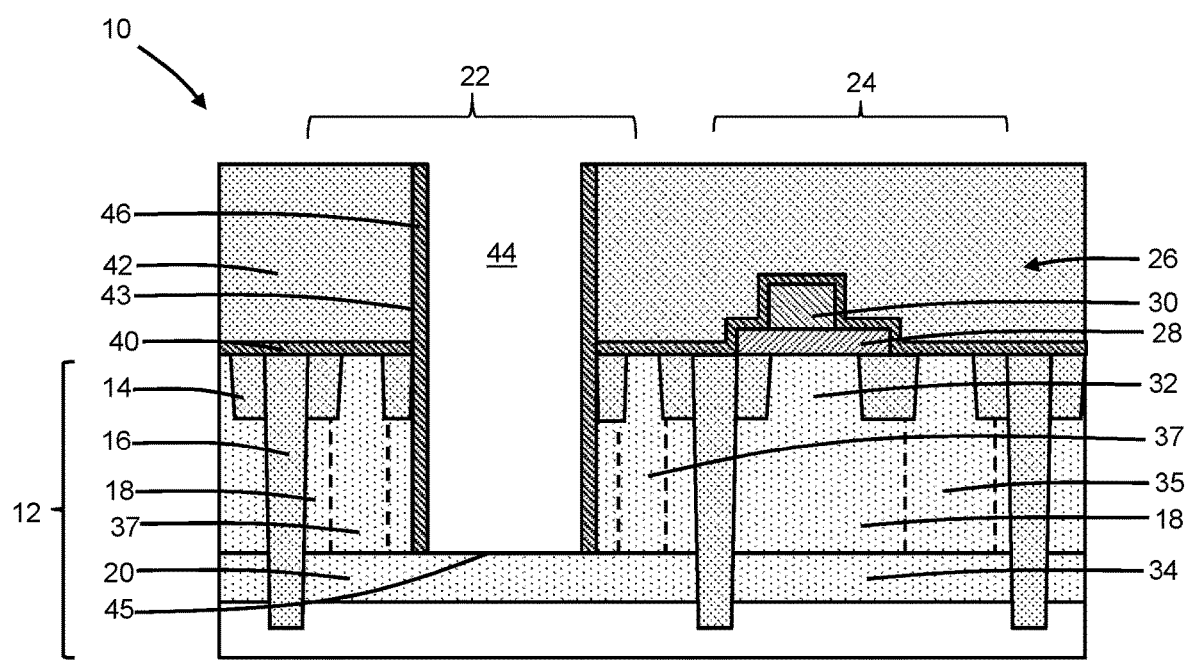

With reference to FIG. 2 in which like reference numerals refer to like features in FIG. 1 and at a subsequent fabrication stage, a trench 44 is patterned by lithography and etching processes in the region 22 of the substrate 12. The lithography process may include forming an etch mask by applying a layer of an organic photoresist by a spin coating process, pre-baking, exposing the photoresist to electromagnetic radiation projected through a photomask, baking after exposure, and developing with a chemical developer to define an opening over the intended location of the trench 44. One or more etching processes, such as reactive ion etching processes, may be used to form the trench 44 with the etch mask present. The trench 44 has sidewalls 43 that extend through the dielectric layer 42, the conformal protection layer 40, and the shallow well 18 to the deep well 20. A portion of the deep well 20 is exposed at a bottom 45 of the trench 44. In the representative embodiment, the trench 44 extends to, but does not penetrate into, the deep well 20. In an alternative embodiment, the trench 44 may extend into, but not fully through, the deep well 20. In an alternative embodiment, the trench 44 may extend fully through the deep well 20 and into the underlying portion of the substrate 12.

The depth or height of the trench 44 may be selected according to the wavelength of the electromagnetic radiation to be detected by the photodiode subsequently formed in the trench 44. The depths of the shallow trench isolation regions 14 and deep trench isolation regions 16 in the substrate 12 may be adjusted, as needed, in conjunction with the selected height of the trench 44 to supply suitable electrical isolation.

Sidewall spacers 46 are formed on the sidewalls 43 of the trench 44. The sidewall spacers 46 may be composed of a dielectric material, such as silicon nitride, that is conformally deposited and then etched with an anisotropic etching process, such as reactive ion etching. The portion of the trench 44 in the substrate 12 is surrounded on all sides by the sidewall spacers 46, which are arranged between the trench 44 and the semiconductor material of the shallow well 18. The portion of the trench 44 in the dielectric layers 40, 42 is also surrounded on all sides by the sidewall spacers 46. The bottom of the trench 44 is cleared of dielectric material by the etching process such that a portion of the deep well 20 is revealed at the bottom of the trench 44.

Figure 3:
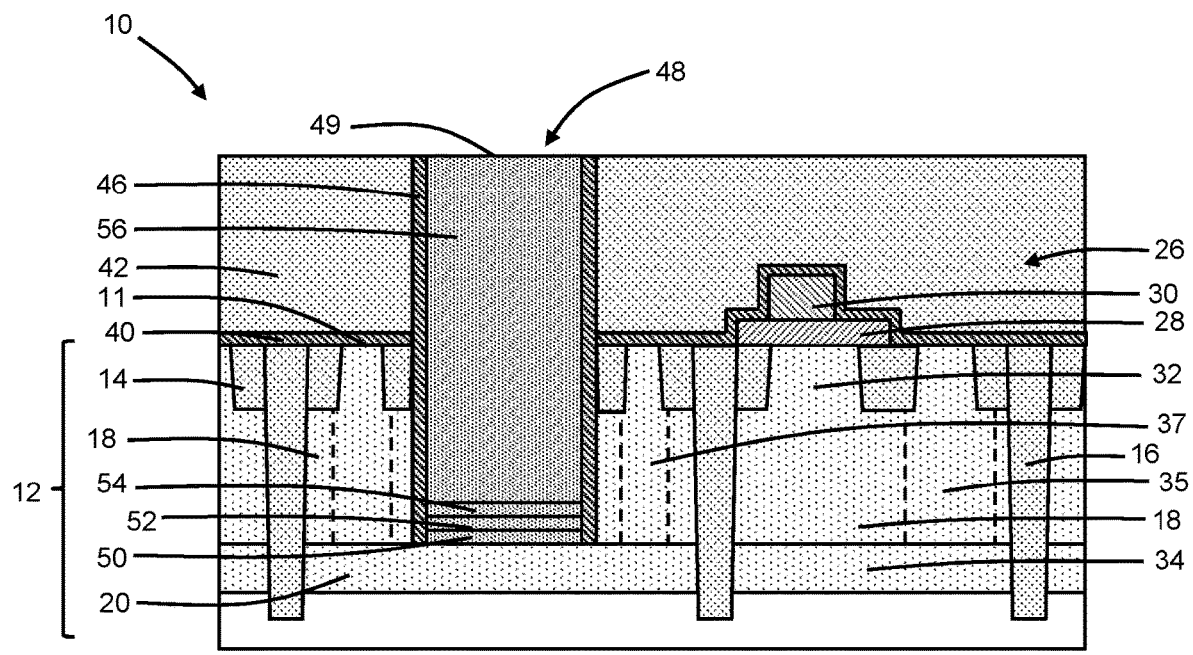

With reference to FIG. 3 in which like reference numerals refer to like features in FIG. 2 and at a subsequent fabrication stage, a photodiode 48 is formed inside the trench 44. The photodiode 48 may be a p-n junction photodiode, a p-i-n junction photodiode, p-i-p-n (avalanche) junction photodiode, p-i-p-i-n (avalanche) junction photodiode, etc. The photodiode 48 has a top surface 49 that may be substantially coplanar or coplanar with a top surface of the dielectric layer 42 and, as a result, the top surface 49 of the photodiode 48 may be considered to be elevated or raised relative to a top surface 11 of the substrate 12. The photodiode 48 may include multiple layers 50, 52, 54, 56 of single-crystal semiconductor material that are epitaxially grown in a layer stack on the portion of the substrate 12 exposed at the base on the trench 44, and then planarized with, for example, reverse mask planarization. Alternatively, the photodiode 48 may be formed by a selective epitaxial growth process that does not require reverse mask planarization. The doped regions 37 and the deep well 20 cooperate to couple the bottom layer 52 of the photodiode 48 to the top surface 11 of the substrate 12.

The layer 50 may be composed of single-crystal silicon that is epitaxially grown from the single-crystal semiconductor material of the substrate 12 and then annealed to provide recrystallization. The layer 52 may be composed of single-crystal silicon that is epitaxially grown from the layer 50. The layer 54 may be composed of single-crystal silicon-germanium that is epitaxially grown from the layer 52. The sidewall spacers 46 prohibit epitaxial growth from the covered sidewalls 43 of the trench 44 within the substrate 12. The growth temperatures for the layers 50, 52, 54 and the anneal temperature may be on the order of, for example, 600° C. In an embodiment, the layers 50, 52, and 54 may be a single layer composed of silicon-germanium with a graded germanium content starting at 0% and ending at 100%. The layer 56 may be composed of germanium that is epitaxially grown from the layer 54 at a growth temperature that is less than the growth temperatures for the layers 50, 52, 54. For example, the growth temperature for the layer 56 may be less than 600° C. In an embodiment, the layer 56 may be composed of silicon-germanium instead of germanium. In an embodiment, the layer 54 may be undoped such that the constituent germanium is intrinsic. In an embodiment, the layer 54 may be lightly n-type doped such that the constituent germanium is substantially intrinsic.

Figure 4:
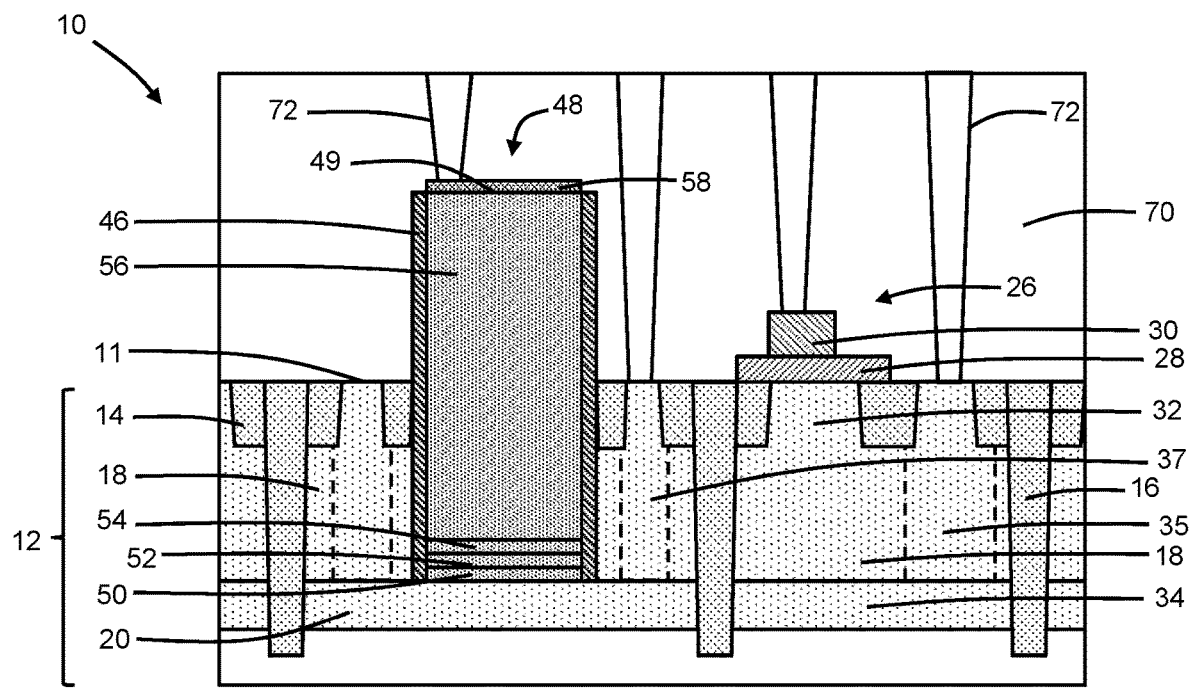

With reference to FIG. 4 in which like reference numerals refer to like features in FIG. 3 and at a subsequent fabrication stage, the conformal protection layer 40 and dielectric layer 42, which are sacrificial, are removed after the photodiode 48 is formed. The conformal protection layer 40 and dielectric layer 42 may be removed by an etching process selective to the sidewall spacers 46. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. Upper portions of the sidewall spacers 46 and an upper portion of the layer 56 of the photodiode 48 project above the top surface 11 of the substrate 12 due to the removal of the layers 40, 42. The layers 50, 52, 54 and a lower portion of the layer 56 are located in the portion of the trench 44 in the substrate 12 that is at and below the top surface 11 of the substrate 12.

An upper portion of the layer 56 of the photodiode 48 adjacent to its top surface 49 may be doped with a p-type dopant, such as boron, by a plasma doping technique, and the dopant may be optionally activated. The addition of the doped region proximate to the top surface 49 of the photodiode 48 defines a portion of a p-i-n (p-type/intrinsic/n-type) photodiode.

A silicide layer 58 may be formed over the layer 56, as well as on portions of the bipolar junction transistor 26 such as the extrinsic base, collector contact, and emitter 30 of the bipolar junction transistor 26, on the source, drain, gate, and body contact of a field-effect transistor in a different region of the substrate 12, or on other active or passive devices. Silicide formation is followed by formation of an interconnect structure including an interlayer dielectric layer 70 and contacts 72 arranged in the interlayer dielectric layer 70. Sections (not shown) of the silicide layer 58 may also form on the extrinsic base portion of the base layer 28 and the emitter 30. A portion of the deep well 20, doped regions 37, and one or more of the contacts 72 may be used to contact the photodiode 48. In addition, the doped regions 35 and one or more of the contacts 72 may be used to contact the subcollector 34 of the bipolar junction transistor 26 that is provided by another portion of the deep well 20.

The substrate 12 may be diced to provide a single die or chip that monolithically integrates both the photodiode 48 and the bipolar junction transistor 26. The photodiode 48 and the bipolar junction transistor 26 each utilize portions of the same deep well 20 for different purposes. In particular, the photodiode 48 utilizes a portion of the deep well 20 as an electrode and the bipolar junction transistor 26 utilizes a different portion of the deep well 20 as the subcollector 34. These different portions are electrically isolated from each other.

Figure 5:
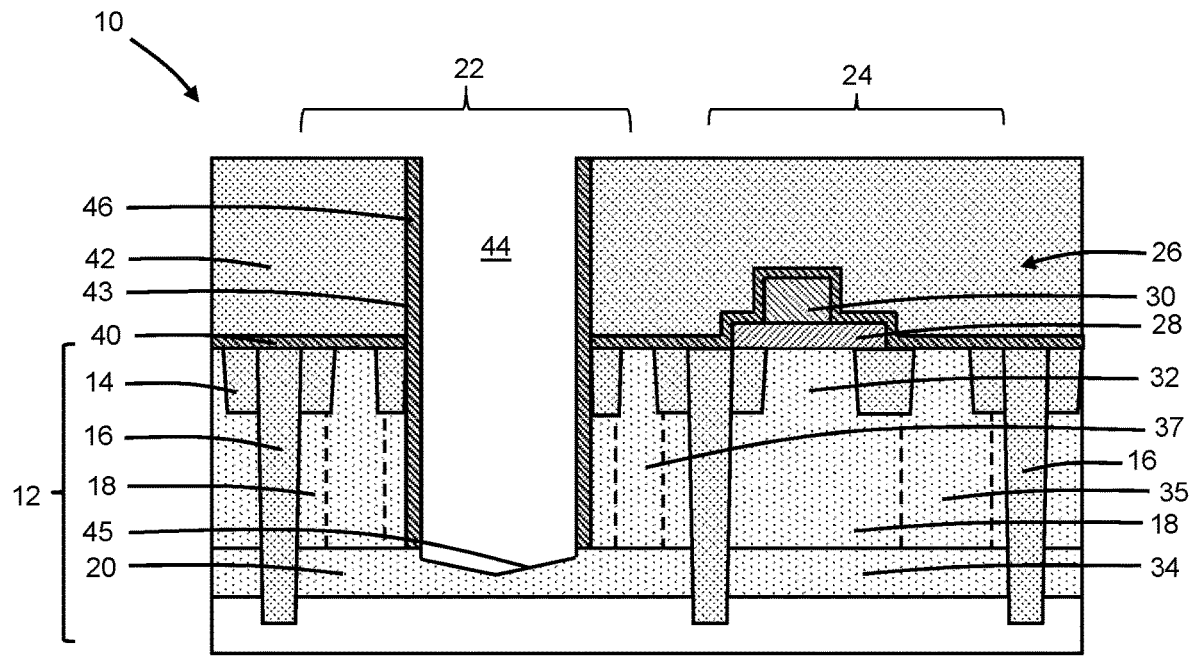
FIGS. 5-6 are cross-sectional views of a structure at successive fabrication stages of a processing method in accordance with alternative embodiments of the invention.

With reference to FIG. 5 in which like reference numerals refer to like features in FIG. 2 and in accordance with alternative embodiments, the trench 44 may be formed to penetrate into, but not fully through, the deep well 20. For example, after the initial etching process forms the trench 44 and the sidewall spacers 46 are formed, a wet chemical etching process with crystallographic selectivity may be used to etch the single-crystal semiconductor material of the substrate 12 exposed at the bottom of the trench 44. The surfaces of the substrate 12 at the bottom 45 of the trench 44 below the sidewall spacers 46 may have inclined sections that extend inwardly to converge and define a chevron shape or V-shape. For example, the wet chemical etching process may etch along the (111) planes of single-crystal silicon.

Figure 6:
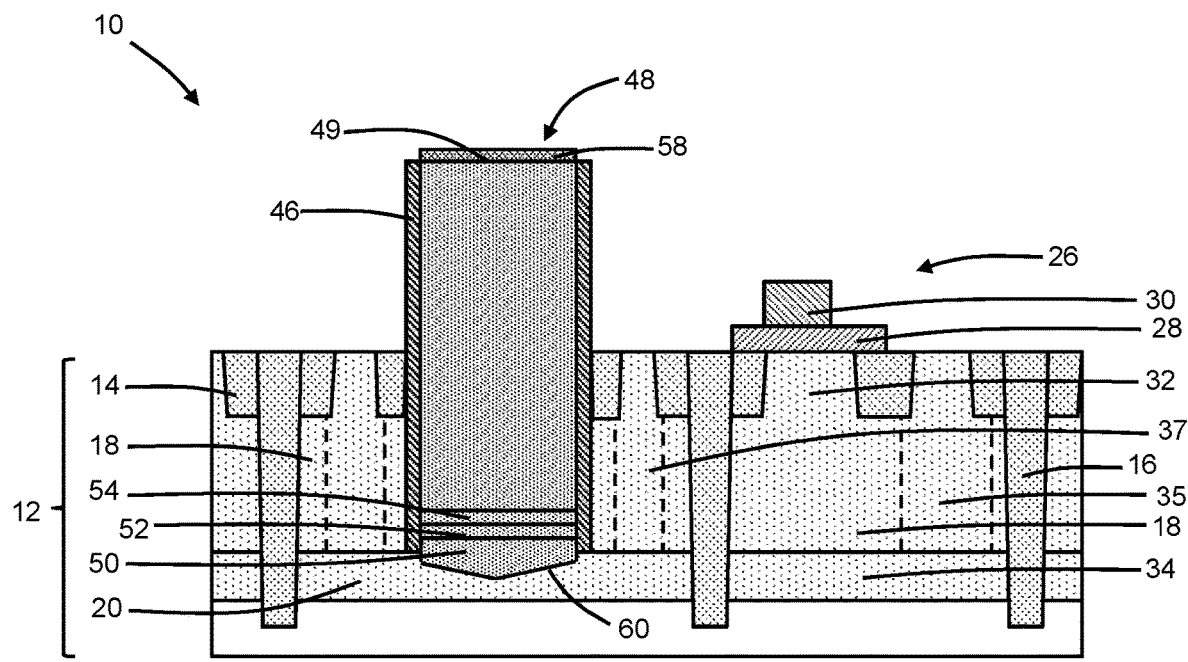

With reference to FIG. 6 in which like reference numerals refer to like features in FIG. 5 and at a subsequent fabrication stage, processing continues as described in connection with FIGS. 3 and 4. In particular, the photodiode 48 is formed in the trench 44 as described in connection with FIG. 3. The lowest portion of the photodiode 48 has inclined lower surfaces 60 that match the chevron shape of the inclined surfaces of the substrate 12 at the bottom 45 of the trench 44. Defects may be gettered and trapped in the lower portion of the photodiode 48 proximate to these inclined surfaces during epitaxial growth of the photodiode 48.

Figure 7:
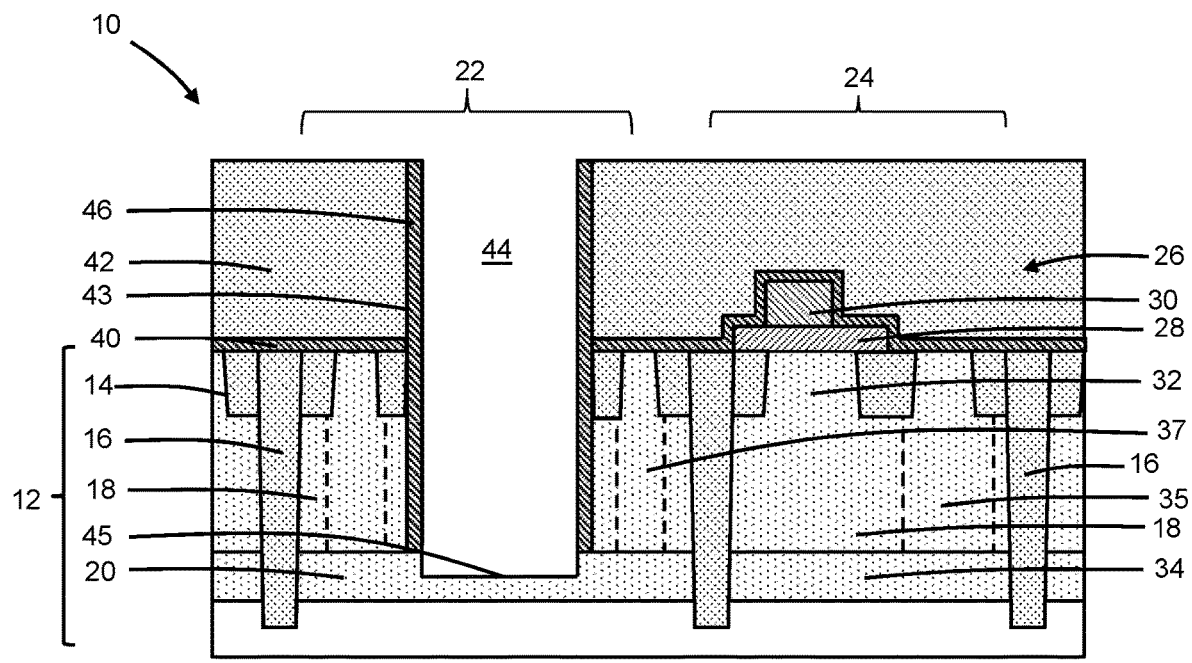
FIGS. 7-8 are cross-sectional views of a structure at successive fabrication stages of a processing method in accordance with alternative embodiments of the invention.

With reference to FIG. 7 in which like reference numerals refer to like features in FIG. 2 and in accordance with alternative embodiments, the trench 44 may be formed to penetrate into, but not completely through, the deep well 20 in a different manner. For example, after the initial etching process forms the trench 44 and the sidewall spacers 46 are formed, the substrate 12 may be oxidized at the bottom of the trench 44 and a wet chemical etching process may be used to strip the oxide. The oxidation and oxide stripping, which may be iterated, may operate to remove damage to the substrate 12 resulting from the initial etching process forming the trench 44 in preparation for epitaxial growth of the photodiode 48. The sidewalls 43 of trench 44 are extended in depth at the bottom 45 of the trench 44 below the sidewall spacers 46.

Figure 8:
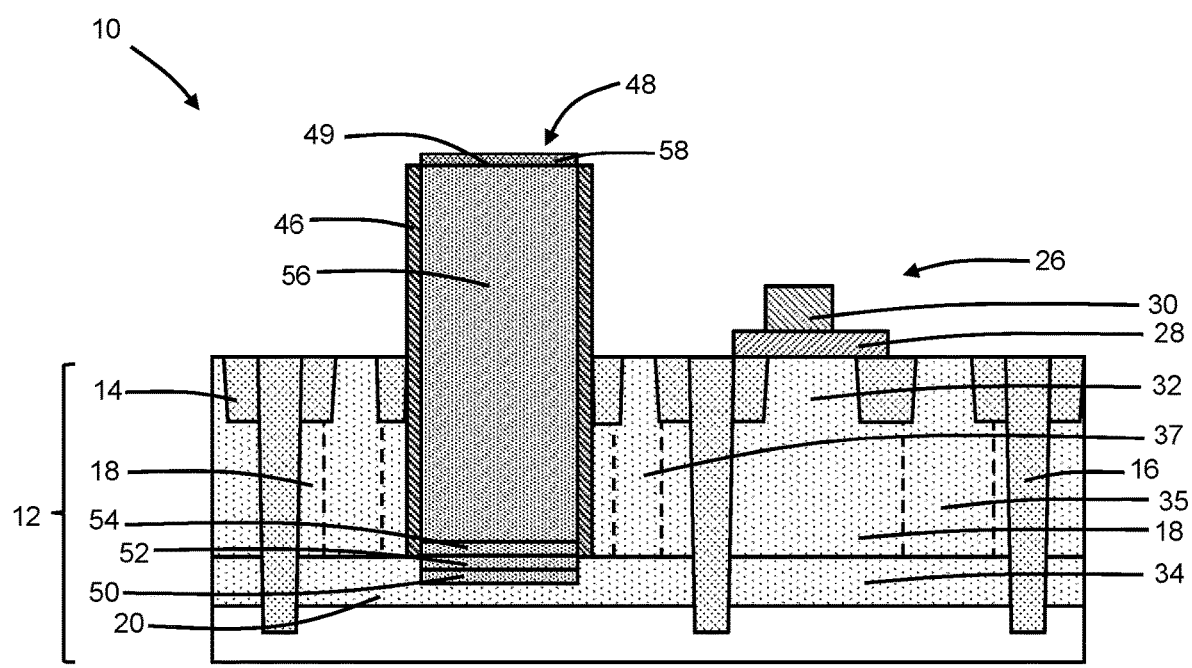

With reference to FIG. 8 in which like reference numerals refer to like features in FIG. 7 and at a subsequent fabrication stage, processing continues as described in connection with FIGS. 3 and 4. In particular, the photodiode 48 is formed in the trench 44 as described in connection with FIG. 3. The lowest portion of the photodiode 48 is positioned in the portion of the trench 44 located in the deep well 20 instead of being located at the interface between the wells 18, 20.

Figure 9:
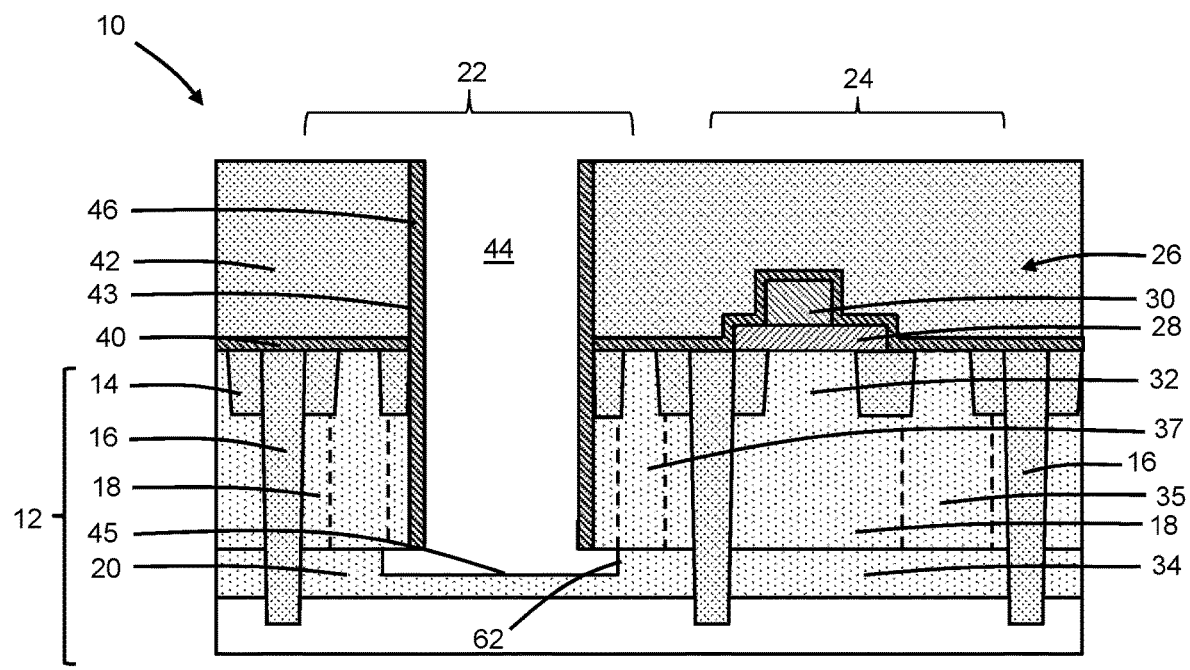
FIGS. 9-10 are cross-sectional views of a structure at successive fabrication stages of a processing method in accordance with alternative embodiments of the invention.

With reference to FIG. 9 in which like reference numerals refer to like features in FIG. 2 and in accordance with alternative embodiments, the trench 44 may be formed to penetrate into, but not completely through, the deep well 20 in still a different manner. For example, after the initial etching process forms the trench 44 and the sidewall spacers 46 are formed, a wet chemical etching process with a lateral etching component may be used to widen and deepen the trench 44. The widened and deepened lowest portion of the trench 44 is located in the deep well 20 and extends below and outwardly beneath the sidewall spacers 46. The widened and deepened lower portion of the trench 44 includes additional sidewalls 62 that intersect the bottom 45 of the trench 44.

Figure 10:
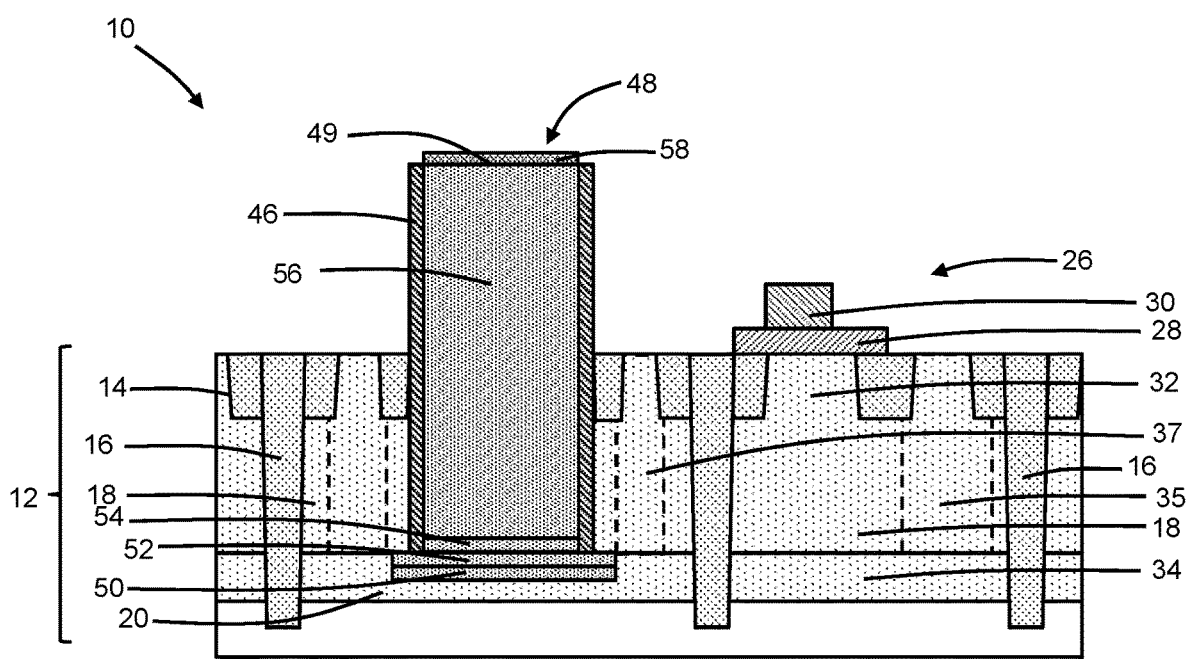

With reference to FIG. 10 in which like reference numerals refer to like features in FIG. 9 and at a subsequent fabrication stage, processing continues as described in connection with FIGS. 3 and 4. In particular, the photodiode 48 is formed in the trench 44 as described in connection with FIG. 3. The lowest portion of the photodiode 48 is located in the widened and deepened lower portion of the trench 44. The lower portion of the photodiode 48 is wider than an upper portion of the photodiode 48, which is positioned interior of the sidewall spacers 46. Defects may be gettered and trapped in the widened and deepened portion of the trench 44 during epitaxial growth of the photodiode 48.

Figure 11:
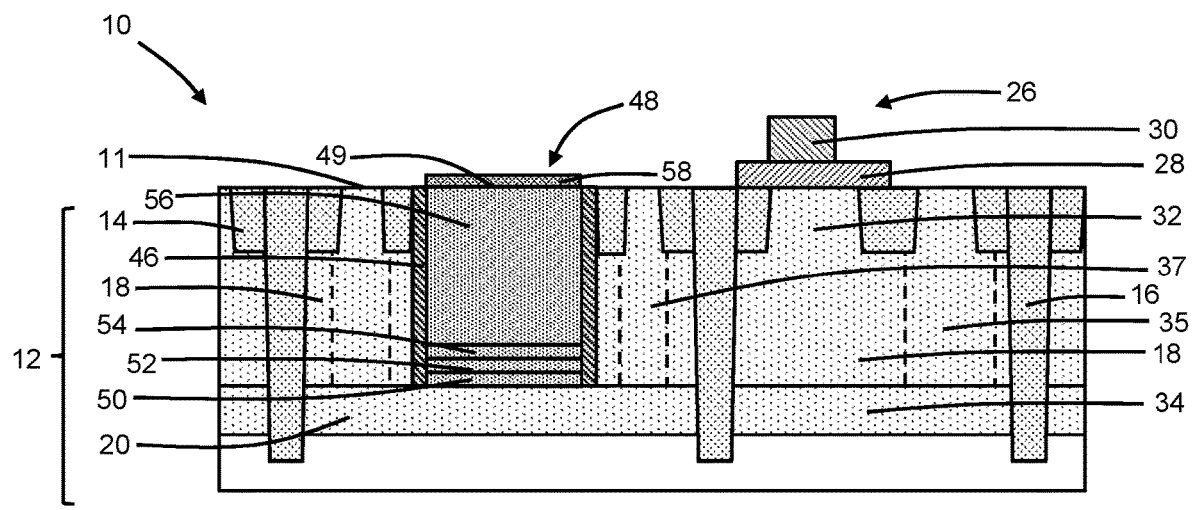
FIG. 11 is a cross-sectional view of a structure in accordance with alternative embodiments of the invention.

With reference to FIG. 11 in which like reference numerals refer to like features in FIG. 3 and in accordance with alternative embodiments, the photodiode 48 may be formed such that the top surface 49 of is coplanar or substantially coplanar with the top surface 11 of the substrate 12. To that end, the dielectric layer 42 may be removed after forming the trench 44 and before forming the sidewall spacers 46 on the sidewalls 43 of the trench 44. A patterned etchback to the level of the conformal protection layer 40 may be used to provide the coplanarity or substantial coplanarity, and may eliminate the need for a polishing process to provide planarization.

With reference to FIGS. 12-15 in which like reference numerals refer to like features in FIG. 3 and in accordance with alternative embodiments, an additional bipolar junction transistor 74 may be formed in the same manner as the bipolar junction transistor 26. The bipolar junction transistors 26, 74 may be wired with other passive elements (e.g., resistors) to construct a circuit 68 (FIG. 15) for a transimpedance amplifier that is coupled to the photodiode 48. The bipolar junction transistors 26, 74 and the photodiode 48, which may be placed in various different layouts, may form a pixel of a Light Detection and Ranging (LIDAR) array.

Figure 12:
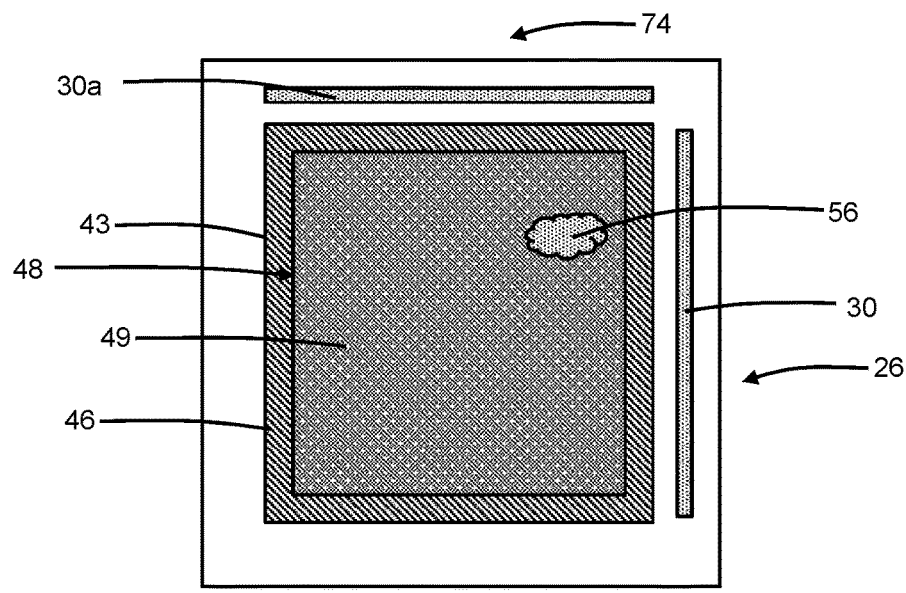
FIGS. 12-14 are top views of structures in accordance with alternative embodiments of the invention.

For example and as shown in FIG. 12, the bipolar junction transistor 26 may be arranged along one sidewall 43 of the trench 44 holding the photodiode 48 with its emitter 30 aligned substantially parallel to the sidewall 43, and the bipolar junction transistor 74 may be arranged along a sidewall 43 of the trench 44 holding the photodiode 48 with its emitter 30a aligned substantially relative to the sidewall 43. The different sidewalls 43 meet at a corner of the trench 44.

Figure 13:
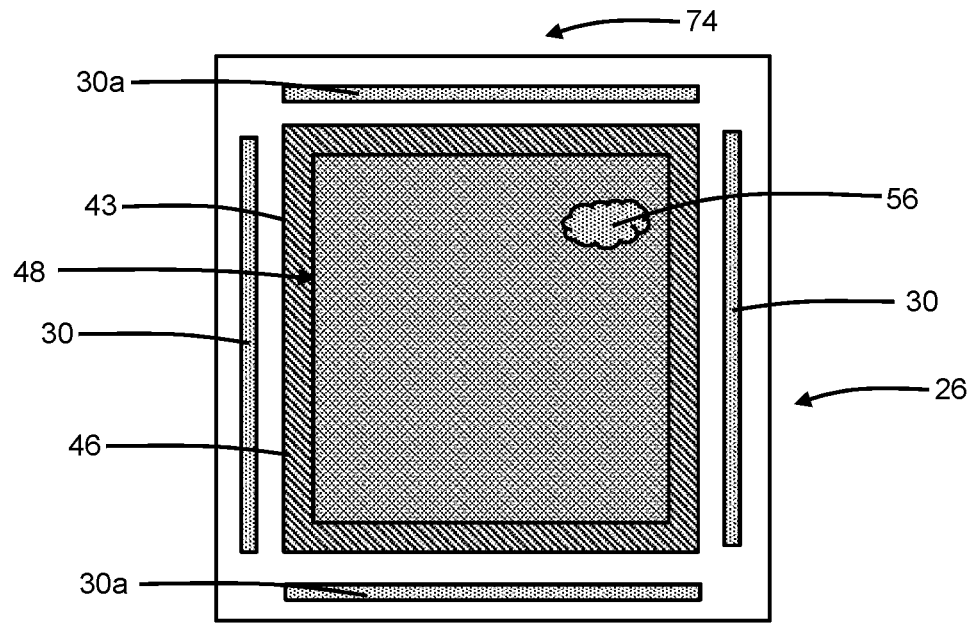
Figure 14:
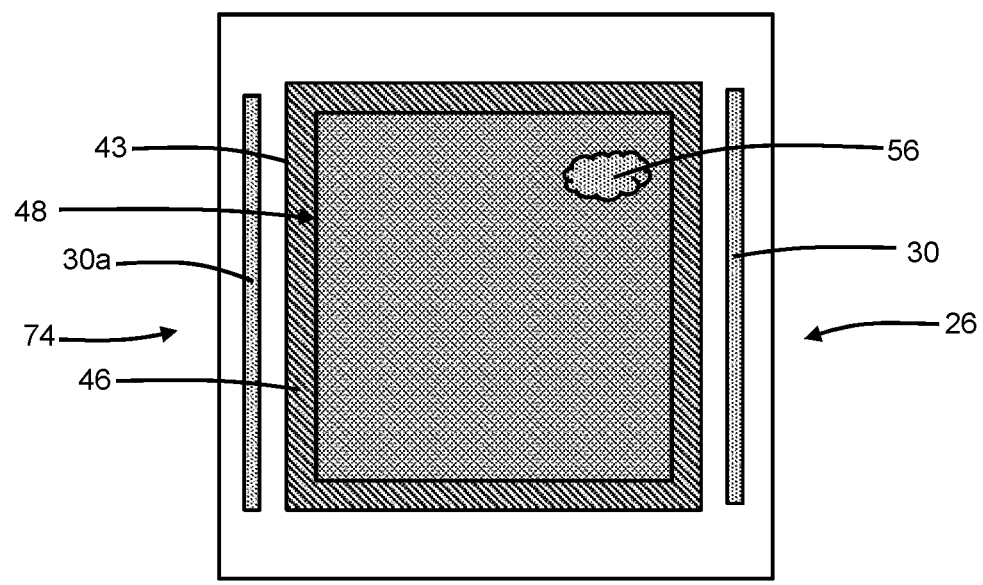
Figure 15:
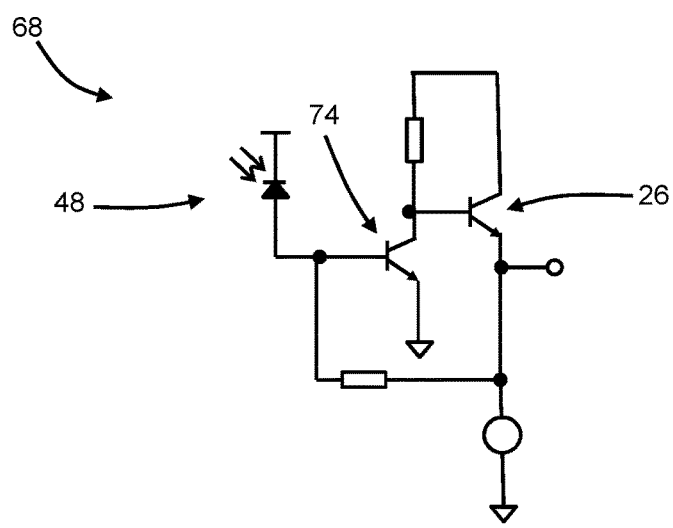
FIG. 15 is a circuit diagram for a trans-impedance amplifier coupled with a photodiode in accordance with embodiments of the invention.

As another example and as shown in FIG. 13, the bipolar junction transistor 26 may be arranged along opposite sidewalls 43 of the trench 44 holding the photodiode 48 with emitters 30 aligned substantially parallel to the opposite sidewalls 43, and the bipolar junction transistor 74 may be arranged along a different set of opposite sidewalls 43 of the trench 44 holding the photodiode 48 with emitters 30a aligned relative to the different set of sidewalls 43. The different sets of sidewalls 43 surround the trench 44 with the sidewalls 43 in each set alternating with each other As another example and as shown in FIG. 14, the bipolar junction transistor 26 may be arranged along a sidewall 43 of the trench 44 holding the photodiode 48 with its emitter 30 aligned substantially parallel to the adjacent sidewall 43, and the bipolar junction transistor 74 may be arranged along an opposite sidewall 43 of the trench 44 holding the photodiode 48 with its emitter 30a aligned relative to the adjacent sidewall 43.

Figure 16:
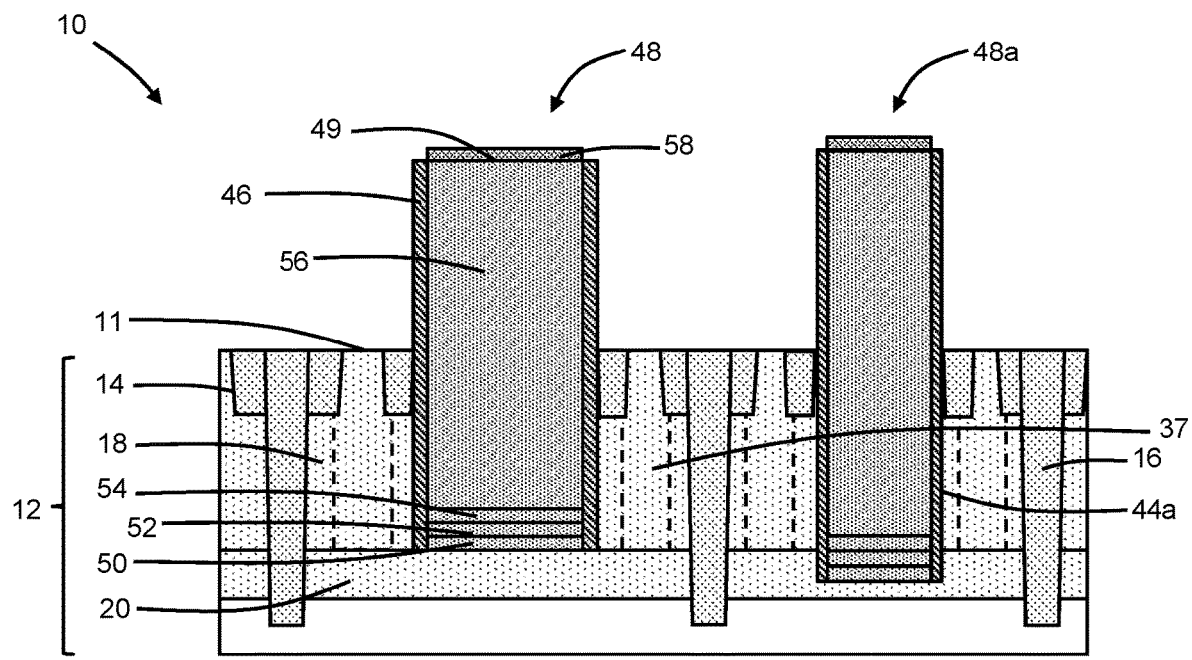
FIG. 16 is a cross-sectional view of a structure in accordance with alternative embodiments of the invention.

With reference to FIG. 16 in which like reference numerals refer to like features in FIG. 3 and in accordance with alternative embodiments, an additional photodiode 48a that is similar to photodiode 48 may be concurrently formed, as previously described in connection with photodiode 48, using the same substrate 12. The additional photodiode 48a may be positioned inside a trench similar to trench 44 that extends to a different portion of the deep well 20, but with a different trench depth to provide multiple photodiodes that are sensitive to electromagnetic radiation at different wavelengths. For example, the thickness of the photodiode 48a may be greater than the thickness of the photodiode 48. In an alternative embodiment, the trenches 44a for the photodiode 48a may extend to the same depth as the trench for the photodiode 48, but the photodiode 48a may project to a different height above the top surface 11 of the substrate 12 than the photodiode 48.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate including a top surface, a first well, and a first trench extending from the top surface to the first well, the first trench having a plurality of sidewalls;
   a plurality of sidewall spacers arranged on the sidewalls of the first trench;
   a first photodiode including a single-crystal germanium-containing layer positioned in the first trench and an electrode comprised of a first portion of the first well; and
   a bipolar junction transistor including a first emitter positioned over the top surface of the substrate and a subcollector positioned below the top surface of the substrate, the subcollector comprised of a second portion of the first well,
   wherein the single-crystal germanium-containing layer of the first photodiode has a top surface that is raised relative to the top surface of the substrate, and the sidewall spacers extend above the top surface of the substrate to the top surface of the single-crystal germanium-containing layer of the first photodiode.

2. The structure of claim 1 wherein the substrate is a single chip integrating the first photodiode and the bipolar junction transistor.

3. The structure of claim 1 further comprising:
   a first trench isolation region positioned between the first portion of the first well and the second portion of the first well.

4. The structure of claim 3 wherein the first trench isolation region extends from the top surface of the substrate through the first well to a portion of the substrate beneath the first well, the substrate has a first conductivity type, and the first well has a second conductivity type of opposite polarity to the first conductivity type.

5. The structure of claim 4 wherein the first trench isolation region is comprised of a solid dielectric material, the first trench isolation region is in direct contact with the first portion of the first well, and the first trench isolation region is in direct contact with the second portion of the first well.

6. The structure of claim 1 wherein the first trench has a bottom, the sidewalls of the first trench extend from the top surface of the substrate to the bottom of the first trench, and the first trench extends outwardly beneath the sidewall spacers.

7. The structure of claim 1 wherein the first trench has a bottom, the sidewalls extend from the top surface of the substrate to the bottom of the first trench, and the substrate at the bottom of the first trench includes a first surface and a second surface that are inclined and converge to define a chevron shape.

8. The structure of claim 1 wherein the substrate includes a second trench extending from the top surface of the substrate to a third portion of the first well, the second trench extends to a greater depth in the substrate than the first trench, and further comprising:
   a second photodiode including a single-crystal germanium-containing layer positioned in the second trench,
   wherein the single-crystal germanium-containing layer of the second photodiode is thicker than the single-crystal germanium-containing layer of the first photodiode.

9. The structure of claim 1 further comprising:
   a second well in the substrate, the second well extending from the first well to the top surface of the substrate, and the first well and the second well having the same conductivity type.

10. The structure of claim 1 wherein the bipolar junction transistor is part of a trans-impedance amplifier that is coupled with the first photodiode, and the substrate is a single chip integrating the first photodiode and the bipolar junction transistor.

11. The structure of claim 1 further comprising:
    a first doped region coupling the first portion of the first well to the top surface of the substrate; and
    a second doped region coupling the second portion of the first well to the top surface of the substrate.

12. The structure of claim 1 wherein the single-crystal germanium-containing layer of the first photodiode is comprised of single-crystal silicon-germanium.

13. The structure of claim 1 wherein the single-crystal germanium-containing layer of the first photodiode is comprised of undoped single-crystal germanium.

14. The structure of claim 1 wherein the single-crystal germanium-containing layer of the first photodiode is comprised of single-crystal germanium that is substantially intrinsic.

15. The structure of claim 1 wherein the sidewall spacers are comprised of silicon nitride.

16. A method comprising:
    forming a well in a substrate;
    patterning a first trench extending from a top surface of the substrate to the well;
    forming a plurality of sidewall spacers arranged on a plurality of sidewalls of the first trench;
    forming a single-crystal germanium-containing layer of a first photodiode in the first trench; and
    forming a bipolar junction transistor having a first emitter positioned over the top surface of the substrate and a subcollector positioned below the top surface of the substrate,
    wherein the single-crystal germanium-containing layer of the first photodiode has a top surface that is raised relative to the top surface of the substrate, and the sidewall spacers extend above the top surface of the substrate to the top surface of the single-crystal germanium-containing layer of the first photodiode, the first photodiode includes an electrode comprising a first portion of the well, and the subcollector of the bipolar junction transistor comprises a second portion of the well.

17. The method of claim 16 further comprising:
before patterning the first trench, forming a sacrificial layer over the top surface of the substrate,
wherein the first trench includes a portion extending through the sacrificial layer, and the first photodiode includes a portion in the portion of the first trench.

18. The method of claim 17 further comprising:
after forming the single-crystal germanium-containing layer of the first photodiode, removing the sacrificial layer.

19. The method of claim 16 wherein the substrate includes a second trench extending from the top surface of the substrate to a third portion of the well, the second trench extends to a greater depth in the substrate than the first trench, and further comprising:
forming a second photodiode in the second trench,
wherein the second photodiode is thicker than the first photodiode.

* * * * *